(12) United States Patent
Keski-Jaskari

(10) Patent No.: US 9,880,663 B2
(45) Date of Patent: Jan. 30, 2018

(54) PIEZOELECTRIC SENSOR, AND AN ELECTRICAL APPLIANCE, AN INSTALLATION OR A GADGET COMPRISING AT LEAST ONE PIEZOELECTRIC SENSOR

(71) Applicant: AITO INTERACTIVE OY, Espoo (FI)

(72) Inventor: Turo Keski-Jaskari, Vantaa (FI)

(73) Assignee: AITO INTERACTIVE OY (FI)

( * ) Notice: Subject to any disclaimer, the term of this patent is extended or adjusted under 35 U.S.C. 154(b) by 0 days.

(21) Appl. No.: 14/767,781

(22) PCT Filed: Feb. 20, 2014

(86) PCT No.: PCT/IB2014/059126
§ 371 (c)(1),
(2) Date: Aug. 13, 2015

(87) PCT Pub. No.: WO2014/128640
PCT Pub. Date: Aug. 28, 2014

(65) Prior Publication Data
US 2015/0378514 A1    Dec. 31, 2015

(30) Foreign Application Priority Data
Feb. 20, 2013  (EP) .................................. 13155986

(51) Int. Cl.
*G06F 3/041* (2006.01)
*H03K 17/96* (2006.01)
*G01L 1/16* (2006.01)

(52) U.S. Cl.
CPC .............. *G06F 3/0418* (2013.01); *G01L 1/16* (2013.01); *H03K 17/964* (2013.01)

(58) Field of Classification Search
CPC ........ G06F 3/0418; G01L 1/16; H03K 17/964
See application file for complete search history.

(56) References Cited

U.S. PATENT DOCUMENTS

2008/0165154 A1   7/2008  Kim
2010/0164479 A1*  7/2010  Alameh ............... G01D 18/006
                                                    324/115

(Continued)

FOREIGN PATENT DOCUMENTS

EP         2261781       12/2010

OTHER PUBLICATIONS

International Search Report for PCT Application PCT/IB2014/059126, EPO, dated Sep. 30, 2014.
Preliminary Report on Patentability, EPO, dated Mar. 4, 2015.

*Primary Examiner* — Towfiq Elahi

(57) ABSTRACT

A piezoelectric sensor with configurable sensitivity thresholds in response to at least one sensitivity threshold command received from a host (28) over a serial data bus (27). The piezoelectric sensor (2) is improved by configuring its microcontroller (26) such that after receiving the sensitivity threshold command, to continue using the at least one actual sensitivity threshold until the sensitivity threshold command has been completely processed and the sensitivity threshold register (30) has been updated by the microcontroller (26), and then to swap to using the updated sensitivity threshold register with the adjusted sensitivity thresholds, and after receiving the sensitivity threshold command, to discard any signals from all piezoelectric sensor elements (20) or at least from such piezoelectric sensor elements (20), to the sensitivity threshold of which the sensitivity threshold command relates, until the microcontroller (26) has completely processed the sensitivity threshold command and updated the sensitivity threshold register (30).

14 Claims, 8 Drawing Sheets

(56) References Cited

U.S. PATENT DOCUMENTS

2012/0206420 A1* 8/2012 Shieh .................. G06F 3/03545
345/179
2012/0313648 A1* 12/2012 Salter ................... H03K 17/955
324/647

* cited by examiner

PIEZOELECTRIC SENSOR, AND AN ELECTRICAL APPLIANCE, AN INSTALLATION OR A GADGET COMPRISING AT LEAST ONE PIEZOELECTRIC SENSOR

FIELD OF THE INVENTION

The invention relates to piezoelectric input sensors and to devices in which such piezoelectric sensors are used.

BACKGROUND ART

Piezoelectric material is material that converts mechanical stress into electrical voltage and vice versa. Traditionally, piezoelectric switches have been appreciated for their durability—a piezoelectric switch may withstand well over 50 million presses.

An excellent piezoelectric sensor is described in published patent application WO 2011/158154. The device described therein comprises in addition to a piezoelectric sensor element also a microcontroller. The piezoelectric sensor element is arranged below the surface of a device in such a manner that, when the device surface is being pressed with a finger, the at least one piezoelectric sensor element is bent, generating a voltage over the at least one piezo electric sensor element. The microcontroller is configured to read the voltage and to output a signal in response to the voltage, after having determined that the measured voltage output from the piezoelectric sensor element is stable enough.

OBJECTIVE OF THE INVENTION

We have found out that characteristics of the device surface below which the piezoelectric sensor element is arranged has a great impact in the sensitivity of the arrangement.

For example, if the material of the device surface is sufficiently thick and rigid, such as when it is made of stainless steel or aluminium with 2 mm thickness, the sensitivity is much different from the situation when the material of the surface is made of material that is less thick and/or rigid, such as when it is made of 1 mm thick plastics.

In the current piezoelectric input sensor design also utilized in context of the piezoelectric sensors described in WO 2011/158154, we need to adjust the sensitivity by compensating for the sensitivity impact caused by the device surface by placing different electrical components, in particular resistors, capacitances and/or inductances, on the circuit board, in such a manner that a given pressure input (e.g. by finger) gives an output signal.

However, the piezoelectric input sensor designer and the manufacturer that delivers the piezoelectric input sensors to a customer that plans to install them into electrical appliances, installations and gadgets do not necessarily exactly know the conditions under which the piezoelectric input sensor shall be operated. For example, the characteristics of the device surface may vary. It is not seldom that the material and thickness of the device surface will be determined only after the design of the appearance of the device is fixed. In addition to or instead of this, even the device surface finish, such as coating or painting, may impact the sensitivity of the piezoelectric sensor. Because piezoelectric sensor devices may need to be ordered before the details of the electrical appliance, installation or gadget are exactly known, it may be very difficult to provide the customers with exact instructions for selecting and correctly placing the electrical components in the circuit board.

We have observed that the attachment of the piezoelectric sensor element below the device surface has caused certain sensitivity variations between each piezoelectric sensor. This means that the force that is required to give user input via the piezoelectric sensor may be different for each piezoelectric sensor. This may be particularly annoying in a device that comprises a plurality of piezoelectric sensor elements if the force that is required to give user input is different in one piezoelectric sensor than in another. In the current implementation, it has not been possible to compensate for the sensitivity variation.

In our implementation of the piezoelectric sensor, the piezoelectric sensor has a relatively simple microcontroller. The electrical appliance, installation or gadget in which our piezoelectric sensor is built, has a host that normally comprises a more powerful processor. The connection between the microcontroller and the host takes place over a serial data bus that has a relatively low bandwidth.

An objective of the invention is to enable calibration of the piezoelectric sensor after it has been assembled inside the electrical appliance, installation or gadget and is in operation. This objective can be fulfilled with the piezoelectric sensor according to claim 1.

A second objective of the invention is to increase design freedom of an electrical appliance, installation or gadget. This objective can be fulfilled with the electrical appliance, installation or gadget according to parallel independent claim.

The dependent claims describe various advantageous aspects of the piezoelectric sensor and of the electrical appliance, installation or gadget.

ADVANTAGES OF THE INVENTION

A piezoelectric sensor comprises a) at least one piezoelectric sensor element having at least two terminals, and b) a microcontroller electrically connected to said at least one piezoelectric sensor element and configured to read a signal indicative of the voltage between the two terminals, and to output at least one output signal in response to the signal read, indicating that the piezoelectric sensor element is being pressed or has been pressed by a finger.

The microcontroller comprises at least one sensitivity threshold register containing at least one sensitivity threshold. The microcontroller is configured to evaluate the signal indicative of the voltage depending on the sensitivity threshold, in consequence of which the sensitivity of the piezoelectric sensor is defined.

Furthermore, the microcontroller is configured, in response to receiving at least one sensitivity threshold command from a host over a serial data bus, to set or to adjust the sensitivity threshold in the sensitivity threshold register, whereby the microcontroller is adapted:

i) after receiving the sensitivity threshold command, to continue using the at least one actual sensitivity threshold until the sensitivity threshold command has been completely processed and the sensitivity threshold register has been updated by the microcontroller, and then to swap to using the updated sensitivity threshold register with the adjusted sensitivity thresholds;

and/or:

ii) after receiving the sensitivity threshold command, to discard any signals from all piezoelectric sensor elements or at least from such piezoelectric sensor elements, to the sensitivity threshold of which the sensitivity threshold command relates, until the microcontroller has completely processed the sensitivity threshold command and updated the sensitivity threshold register.

An advantage that can be obtained with the piezoelectric sensor is that the piezoelectric sensor can be calibrated also after it has been assembled inside the electrical appliance, installation or gadget while it is in operation, despite it having a relatively simple microcontroller that is connected to the host normally having a more powerful processor, and despite the fact that the connection is carried out via a serial data bus that has a relatively low bandwidth.

Alternative but combinable features i) and ii) both help avoiding interpreting piezoelectric sensor signals incorrectly during processing of the sensitivity threshold command at the microcontroller. It may well be that the processing of the sensitivity threshold command at the microcontroller takes more time, such as when the sensitivity threshold command is for setting of a plurality of thresholds.

Without the features i) and/or ii) implemented, in a situation described in the preceding paragraph, it may happen that if some but not all of the thresholds have not yet been updated, the functioning of the piezoelectric sensor might be impaired.

For instance, increasing or lowering one sensitivity threshold for a piezoelectric sensor element for which a plurality of sensitivity thresholds have been defined usually makes it necessary to update also the other sensitivity thresholds, or at least some of them. Now, we see that the pressing of a piezoelectric sensor element may be interpreted incorrectly if not all or at least not the necessarily updatable sensitivity thresholds have been updated.

In still other words, since we can now change the sensitivity threshold of a piezoelectric sensor element by sending a sensitivity threshold command, we can not only avoid the need to replace the electrical components for matching the piezoelectric sensor element if the customer's application changes. And even better, we can change the sensitivity threshold of the piezoelectric sensor element whenever required—"on the fly"—by sending the sensitivity threshold command.

The invention is particularly useful if the piezoelectric sensor comprises a plurality of piezoelectric sensor elements and the sensitivity threshold register comprises a plurality of sensitivity threshold values each defining a sensitivity threshold, and if in the microcontroller, each of the sensitivity thresholds is associated to a particular piezoelectric sensor element or to a group of piezoelectric sensor elements, since in this case the otherwise much larger probability of not being able to avoid interpreting piezoelectric sensor signals element incorrectly can be reduced.

First, processing the sensitivity threshold command at the microcontroller is probable to take more time since it may be necessary to update the sensitivity thresholds for a plurality of piezoelectric sensor elements and so to perform more register operations. Second, it may be that the host is busy with other tasks and can give only a relatively small fraction of its operating time for the piezoelectric sensor. Without the inventive feature, it might well happen that the host decided to send a sensitivity threshold command after the user has already given user input by pressing by finger on a piezoelectric sensor. Since the connection between the microcontroller and the host takes place over a serial data bus, without having the features i) and/or ii) implemented, the risk for incorrectly interpreting piezoelectric sensor element signals would be larger.

In still other words, we can change the sensitivity threshold of particular piezoelectric sensor elements or a group of piezoelectric sensor elements. This improves the configurability of the piezoelectric sensor, since not all piezoelectric sensor elements need to have the same sensitivity threshold.

If the microcontroller is configured to adjust or to set sensitivity threshold values for a plurality of piezoelectric sensor elements individually in response to receiving the sensitivity threshold command, the time for communicating the sensitivity threshold command in the serial data bus can be reduced, also for more complicated sensitivity threshold setting operations. In other words, we may facilitate the programming of the sensitivity thresholds of the piezoelectric sensor elements, because it is not necessary to access the microcontroller for adjusting or setting each sensitivity threshold element separately. In particular, if the microcontroller is a simple one, we can in this manner avoid the need to communicate a separate sensitivity threshold command to each piezoelectric sensor element, the sensitivity threshold of which is to be set or adjusted. In particular, in this manner we may significantly speed up the setting or adjusting of the sensitivity thresholds that may be significant if the piezoelectric sensor comprises many piezoelectric sensor elements.

If the piezoelectric sensor further comprises c) signalling means configured to acoustically, haptically and/or optically signal that the pressing on a piezoelectric sensor element by the finger has exceeded a sensitivity threshold, is below a sensitivity threshold, or matches with a sensitivity threshold, and if the microcontroller further comprises at least one signalling register and is configured, in response to receiving at least one signalling register command from the host over the serial data bus, to set or adjust the at least one signalling register, and to change an operating pattern according to which the signalling means are used depending on the contents of the at least one signalling register, the comfort of use may be improved because the user may so receive feedback immediately or almost immediately whether the pressing by the finger was accepted by the piezoelectric sensor. Furthermore, the feedback signalling pattern may be changed. This may improve user comfort, since as the sensitivity threshold of the piezoelectric sensor may be changed, it may become necessary to also signal to the user in which mode the piezoelectric device is currently being used.

If the signalling means comprise any of the following: a loudspeaker, a buzzer, any of the piezoelectric element(s) of the piezoelectric sensor, a lamp, in particular a LED, the feedback signalling can be implemented in a quite simply manner Preferably, as the signalling means the microcontroller may be configured to use the piezoelectric sensor element on which the pressing by the finger is being detected or has been detected, to give tactile feedback by switching on and off a signal to be emitted through the piezoelectric sensor element.

Advantageously, the sensitivity threshold command may be transmitted in a signalling register command or vice versa. This simplifies the design of the serial bus communication interface of the piezoelectric sensor device.

The calibration of the piezoelectric sensor can be simplified if the microcontroller is configured to switch on a signal to be emitted through the at least one piezoelectric sensor element, and during the piezoelectric emitting the signal, to switch off the signal and to measure the voltage indicative of the voltage between the two terminals of the same at least one piezoelectric sensor element, and to use the measured voltage for self-calibration of the piezoelectric sensor. The self-calibration of the sensitivity threshold levels by detecting the response of the piezo sensor to a known tactile signalling stimulus can be used to ensure that any tolerances or changes in the sensitivity levels of the user interface that could be due to mechanical or electrical variance of the electrical appliances, or conditions caused by the mechanical assembly or any other conditions that may have been induced during its manufacturing or operating lifetime may be compensated.

If the sensitivity threshold register comprises one or more sensitivity threshold values, each of which is a function of the magnitude of the voltage, the length of the voltage window, and/or the number of voltage sequences that are required to accept signal from a piezoelectric sensor element as a user input, we can specify the particular details of the sensitivity threshold that is to be set or adjusted. This improves the versatility of the piezoelectric sensor.

If the plurality of sensitivity threshold values is stored in a two-dimensional matrix, we may address the sensitivity threshold elements in a particularly convenient and effective manner.

If the microcontroller is configured to change values in the matrix in a given row or column in response to receiving the sensitivity threshold command, we may obtain a particularly easy and fast way to set or adjust the sensitivity threshold or thresholds.

The serial data bus for receiving sensitivity threshold commands may be the $I^2C$ data bus or the SPI data bus. These serial data buses offer a very limited bandwidth. Typically, if information is communicated in series in byte level, 8 bits are transmitted in parallel.

The versatility of the piezoelectric sensor can be improved, if the microcontroller is configured to:
use at least two sensitivity levels for interpretation of the signal indicative of the voltage between the two terminals of the at least one piezoelectric sensor element during one touch interaction;
and/or
apply at least one relation stored in the microcontroller to select a relation between the signal indicative of the voltage between the two terminals of the at least one piezoelectric sensor element and driving of the signalling means, as described in any one of claims 4 to 8, during the touch interaction.

Configuration adjustment of the sensitivity levels during one touch interaction task of the user is especially beneficial on communicating and adjusting threshold sensitivities of several levels for different purposes. For example, when the user tries to locate the key implemented by piezoelectric sensor on a smooth surface based on his tactile senses only, it is very beneficial to detect that the key has been found based on detecting of light pressure level by tactile signalling to the user. The user can use the same key for switching purposes (pressing action) if the same key is used with a different threshold level and corresponding signalling, in particular during the one touch interaction. Adjusting the sensitivity threshold level or levels dynamically by relations stored in microcontroller and responsive to the pressure of which user is touching the key or the piezoelectric sensor element, different levels of thresholds and corresponding signalling can be adaptive to user behavior and use context.

Alternatively or additionally, the values written into the sensitivity register by the host over the data bus can be configured by microcontroller to affect the said relation (like increase, decrease, filter, or otherwise parameterize the relation), by which the microcontroller relates the driving of its signalling means with finger pressure changes applied to the piezoelectric sensor.

The electrical appliance, an installation or a gadget comprises a host, a device surface, and at least one piezoelectric sensor of any of the above kind arranged below the device surface in such a manner that, when the device surface is being pressed with a finger, the at least one piezoelectric sensor element of the piezoelectric sensor is bent, generating a voltage over the at least one piezo electric sensor element, and connected to the host via a serial data bus.

The host is configured to use at least one output signal transmitted to the host from the microcontroller over the serial data bus as user input to the appliance, the installation or the gadget.

An advantage is that the sensitivity of the piezoelectric sensor element can be adjusted according to the use situation of the electrical appliance, installation or gadget, for example if the electrical appliance, installation or gadget is first used in a first mode of operation and then in a second mode of operation, in a manner that reduces the probability of interpreting piezoelectric sensor element signals incorrectly.

In this manner, thanks to the piezoelectric sensor, it is possible to increase manufacturing tolerances of the appliance, installation or gadget. In particular, the variation in the arrangement in the piezoelectric sensor element under the device cover may be better compensated for.

If in the electrical appliance, installation or gadget according to the piezoelectric sensor is a piezoelectric sensor according to any one of the claims 4 to 8, and if the electrical appliance, the installation or the gadget is configured to use the signalling means acoustically, haptically and/or optically to signal to that user input has been entered, the user comfort of the electrical appliance, installation or gadget may be increased since now it is possible to give to the user feedback whether the pressing by the finger has been accepted by the piezoelectric sensor.

The electrical appliance, the installation or the host may be configured to command the microcontroller to set or to adjust the sensitivity threshold between two consecutive user inputs. An advantage is that as the application state in the host can change based on the first user input, it can now re-configure the microcontroller accordingly, to correspond with the new state, already before the user initiates next input.

If the electrical appliance, the installation or the gadget is configured to adjust or set the sensitivity threshold for at least one piezoelectric sensor element of the piezoelectric sensor between the function of a touch switch and a force meter which detects a discrete number of force magnitudes, the piezoelectric sensor can also be used as a force meter. The force meter preferably detects a discrete number of force magnitudes and gives user input accordingly. Typically, the number of force magnitudes can be between three and ten.

If in the electrical appliance, installation or gadget the piezoelectric sensor element is also configured to produce a signal to the at least one piezoelectric sensor element to make it vibrate, and the electrical appliance, installation or gadget is configured to calibrate the sensitivity of the at least one piezoelectric sensor element by i) producing a test signal to the at least one piezoelectric sensor element and ii) comparing the signal indicative of the voltage of the at least one piezoelectric sensor element caused by the test signal, and iii) setting or adjusting the sensitivity threshold so that the at least one piezoelectric sensor element produces a user input as a response to the test signal, manufacturing tolerances can be evened out or compensated for in a relatively simple manner.

If in the electrical appliance, installation or gadget, the piezoelectric sensor is configured to produce a signal to a plurality of piezoelectric sensor elements to make them vibrate, and if the electrical appliance, installation or gadget is configured to calibrate the sensitivity of each of said plurality of piezoelectric sensor elements by: i) producing a test signal to said plurality of piezoelectric sensor elements;

and ii) comparing the signal indicative of the voltage of each piezoelectric sensor element caused by the test signal; and iii) setting or adjusting the sensitivity threshold so that each of the piezoelectric sensor elements produces a user input as a response to the test signal, manufacturing tolerances between the arrangement of each piezoelectric sensor element under the device cover can be evened out or compensated for in a relatively simple manner. This makes it possible to ensure that all piezoelectric sensors in the electrical appliance, installation or gadget require a certain force.

When the electrical appliance, the installation or the gadget is configured to adjust or set the sensitivity threshold for at least one piezoelectric sensor element of the piezoelectric sensor between the function of a touch switch and a level switch, the piezoelectric sensor can be used as a level switch.

BRIEF DESCRIPTION OF THE DRAWINGS

In the following, the invention is described in more detail with the examples shown in the accompanying drawings in FIGS. 1 to 13, of which.

Same reference numerals refer to same or similar structural elements in all FIG.

DETAILED DESCRIPTION

Figure 1:
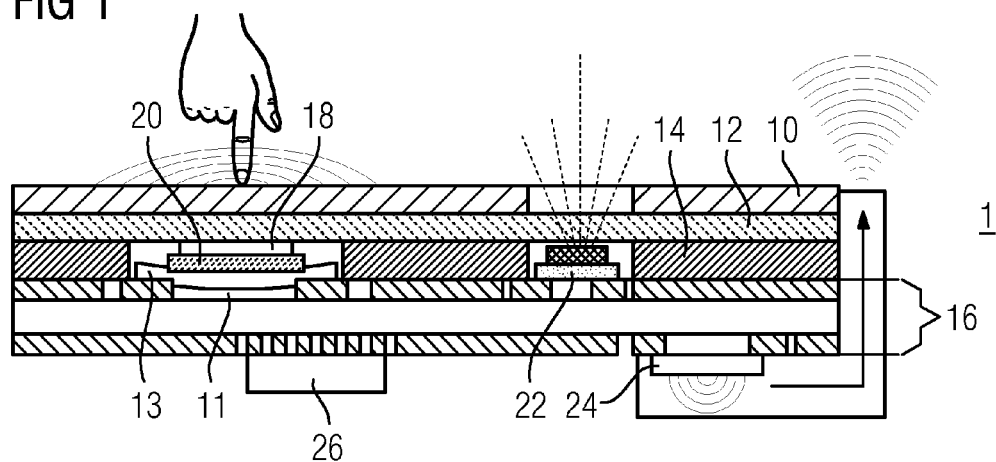
FIG. 1 illustrates a piezoelectric sensor that has been arranged below a device cover of an electrical appliance.

FIG. 1 illustrates piezoelectric sensor 2 that has been arranged below a device cover 10 of an electrical appliance 1. The piezoelectric sensor 2 comprises a two-layer printed circuit board 16, in which there is recess 11 on top of which metal plate 13 has been attached. On metal plate 13 there is piezoelectric sensor element 20. On top of piezoelectric sensor element 20 there is conductive adhesive. Conductive foil 12 is arranged between device cover 10 and double sided adhesive 14 attached to the upper layer of the printed circuit board 18.

Piezoelectric sensor 2 comprises microcontroller 26, at least one LED 22 that may be soldered on the printed circuit board 18, and at least one buzzer 24.

Figure 2:
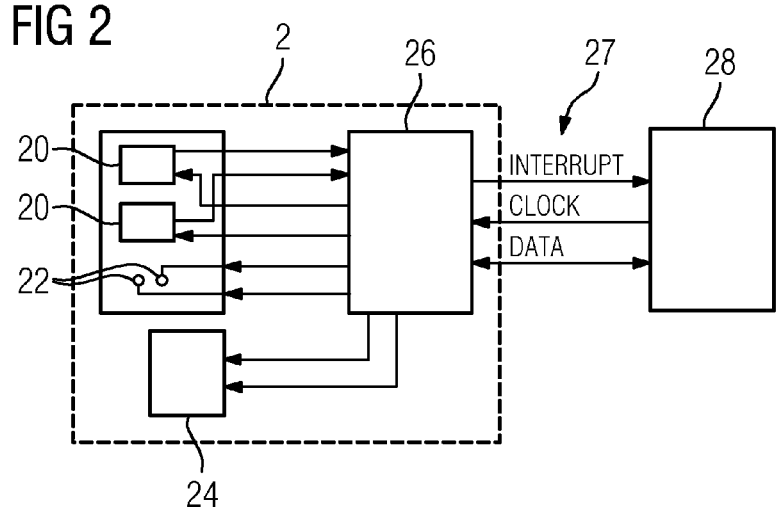
FIG. 2 is a schematic diagram showing the simplified structure of the piezoelectric sensor shown in FIG. 1, and how it communicates with a host.

FIG. 2 is a schematic diagram showing the simplified structure of piezoelectric sensor 2 and how it communicates with a host 28. Host 28 provides clock signal (CLOCK) to microcontroller 26 via I²C bus.

The data connection (DATA) can be used in any direction, however so that host 28 can send instructions over the data connection any time. Microcontroller 26 can transmit over the data connection only after having submitted an INTERRUPT message to host 28. Then host 28 interrogates microcontroller 26.

Figure 3:
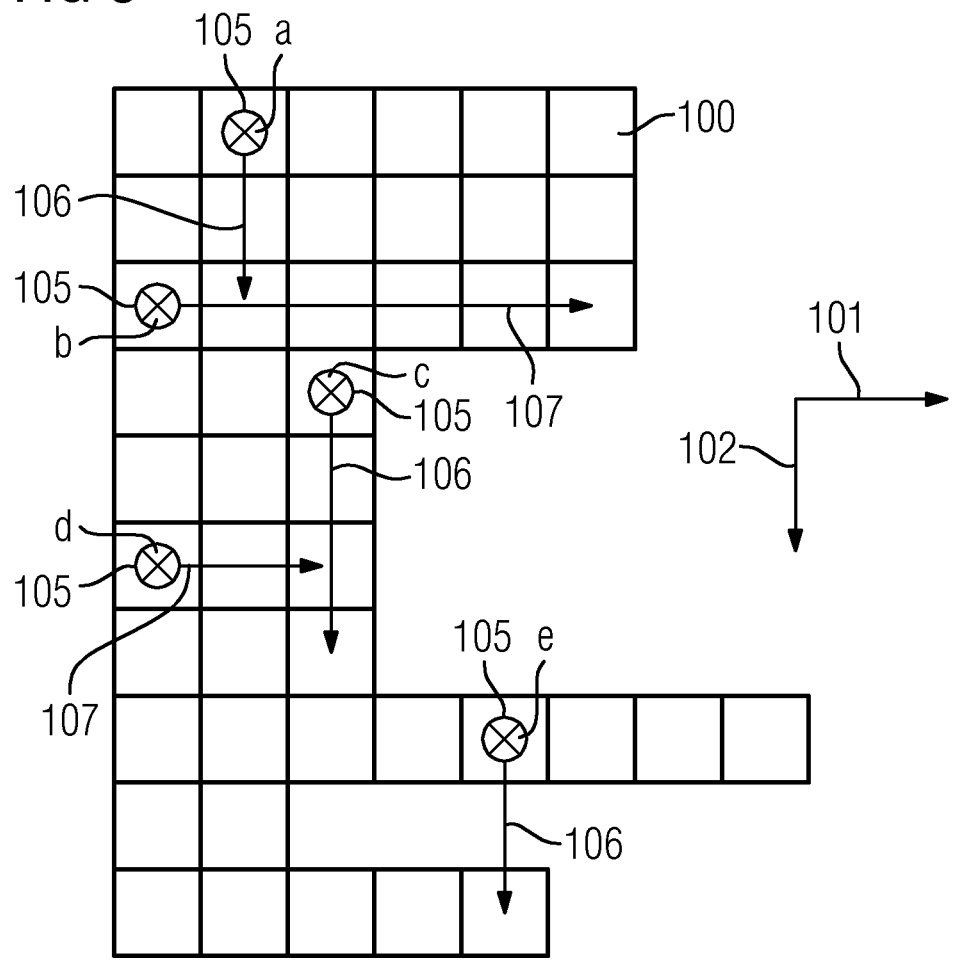
FIG. 3 illustrates the sensitivity threshold register (particular example of sensitivity threshold matrix)

FIG. 3 illustrates sensitivity threshold register 30 that particularly advantageously can be implemented as sensitivity threshold matrix, consisting of dimensions 101 and 102 and further containing for example sensitivity thresholds and/or feedback signalling configuration. Alternatively, the sensitivity threshold register 30 can be implemented as a list.

In the following, we refer to a command to microcontroller 26 with the term "access".

In theory, sensitivity threshold register 30 may comprise any number of rows and each row any number of columns. However, in practice, microcontroller 26 used to implement piezoelectric sensor 2, and device 1 in which piezoelectric sensor 2 is used, may pose certain limitations as regards the maximum number of rows and columns.

Sensitivity threshold register 30 may be implemented as one-dimensional register. In this case, the dimensions 101, 102 may be as a list or as lists.

In the following, we refer to sensitivity threshold elements 100 of sensitivity threshold register 30 that is implemented as a matrix. More generally, sensitivity threshold elements 100 may be understood as sensitivity threshold values.

Configuration is compilation of elements 100 in either dimension 101, 102. Groups of two or more elements 100 in the 102 dimension (i.e. in a column) are called entities (button sensitivity configuration entity, feedback signalling configuration entity), and groups of two or more elements 100 in the 101 dimension (i.e. in a row) are said to contain values.

Thus, a crossing point of an entity group and value group of elements in FIG. 3 can in practice mean that the value in element 100 in the crossing point describes a feature or part of a feature of the said entity, for example sensitivity threshold in the piezo button configuration. Each access (that have in FIG. 3 been denoted with symbols a, b, c, d, and e but which may be in any number) is initiated from origin 105, which may be anywhere in the sensitivity threshold register 30.

In addition, configurations in dimensions 102 can be called entity and configurations in dimensions 101 as value. In this case there can be entity access 106 and value access 107. As can be seen (cf. symbol e), access can also jump over empty element or empty elements.

Figure 4:
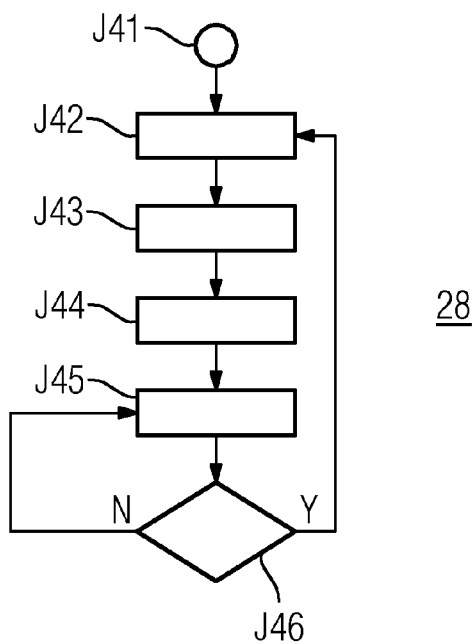
FIG. 4 is a flow diagram illustrating the setting of contents of the threshold register in the host.

FIG. 4 is a flow diagram illustrating the setting of contents of the sensitivity threshold register 30 in host 28.

The processing starts at step J41. In step J42, access origin is set. In step J43, access dimension is set. In step J44, access direction is set. In step J45, data byte is read or written. In step J46 it is tested whether the access is complete. If it is not ready, then next data byte is read or written by returning to step J45. If the processing is ready in J46, then processing goes back to step J42.

Figure 5:
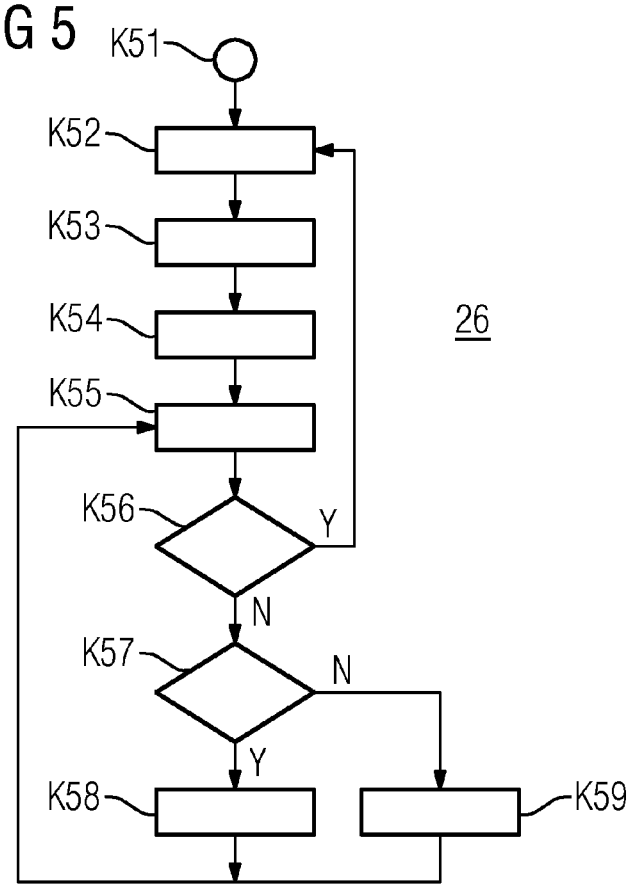
FIG. 5 is a flow diagram illustrating the setting of contents of the threshold register in the piezoelectric sensor.

FIG. 5 is a flow diagram illustrating the setting of contents of the sensitivity threshold register 30 in memory of microcontroller 26.

The processing starts at step K51. In step K52, access origin is received. In step K53, dimension is received. In step K54, direction is received. In step K55, byte is sent or received. In step K56, it is tested whether the setting is ready. If no, in step K57 direction is tested. If direction is positive, in step K58 address is incremented in dimension set in step K53. If direction is negative, in step K59 address is decremented in dimension set in step K53.

Figure 6:
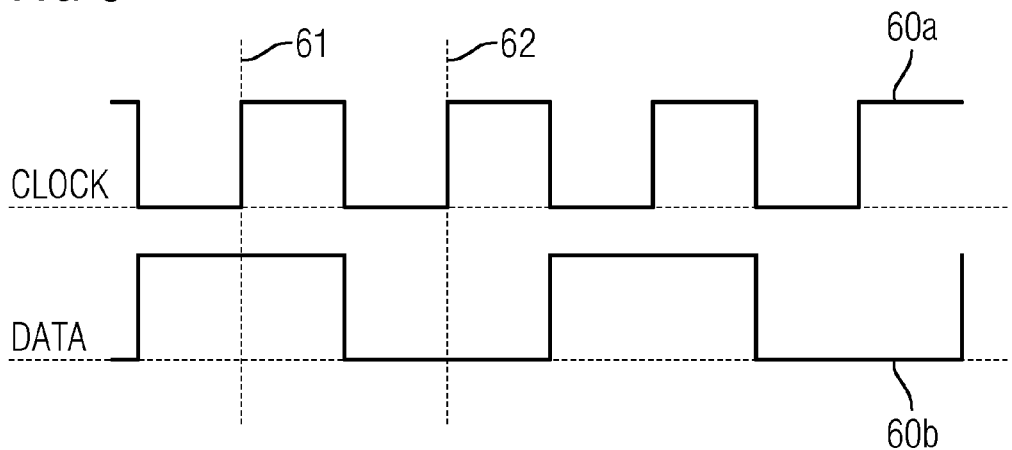
FIG. 6 illustrates host write process in the level of individual bits.

FIG. 6 illustrates host write process in the level of individual bits. At 61, a "1" is written and at "62" a "0" is written. 60a denotes clock signal line. 60b denotes data signal line.

Figure 7:
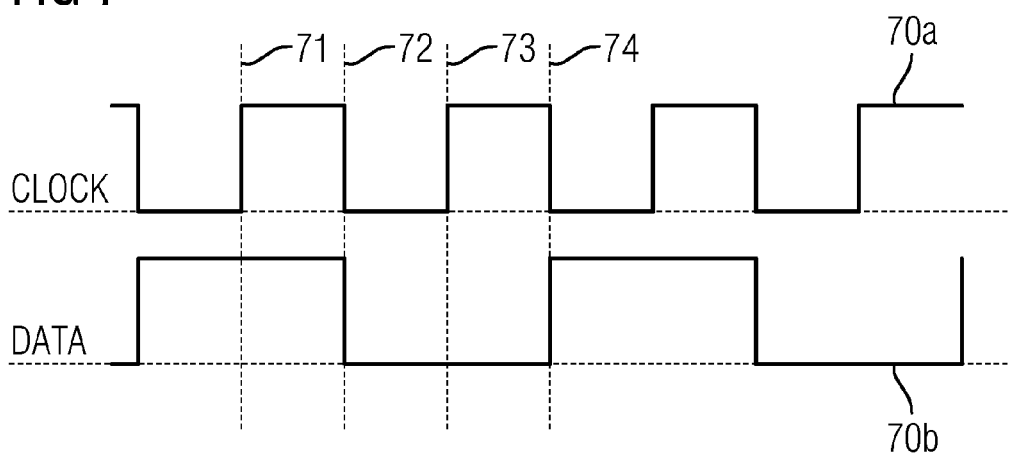
FIG. 7 illustrates host read process in the level of individual bits.

FIG. 7 illustrates host read process in the level of individual bits. At 71, a "1" is read. At 72, microcontroller 26 sets next bit "0" to data line (DATA). At 73, a "0" is read. At 74, microcontroller 26 sets next bit "1" to data line. 70a denotes clock signal line and 70b data signal line.

Figure 8:
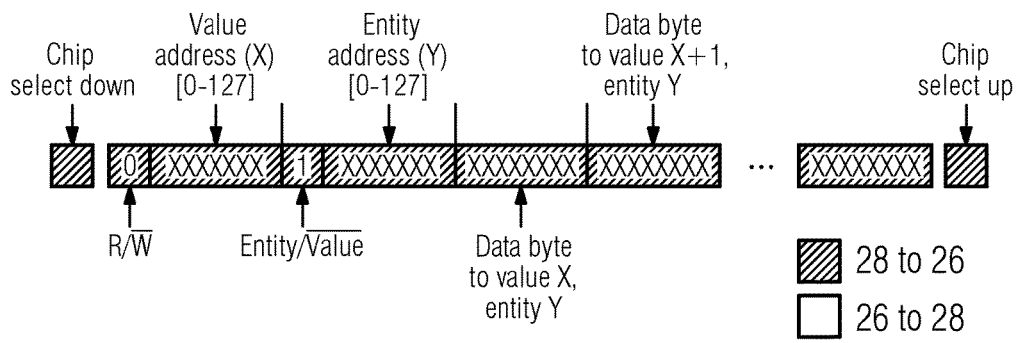
FIGS. 8 and 9 illustrate access by host to microcontroller by SPI communication bus.

FIG. 8 illustrates access by host 28 to microcontroller 26 by SPI communication bus, where each letter or number corresponds to individual bit, and series of "X" the serial data. Entity/value bit in the access (i.e. command) denotes the access dimension, as set in also in J43 in FIG. 4. With every clock cycle, a bit is usually clocked to both directions, but both sides know that the first two bytes are the header i.e. from host 28 to microcontroller 26 and that in a cycle marked as "read" any forthcoming bytes contain information to the other direction i.e. from microcontroller 26 to host 28.

Figure 9:
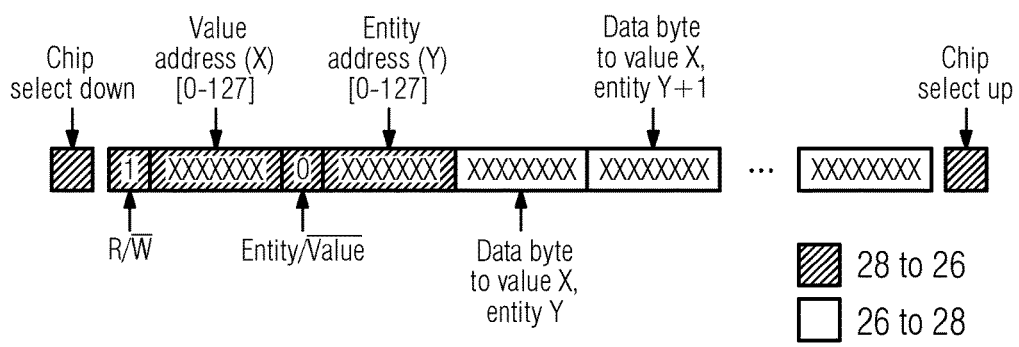

FIG. 9 illustrates write access by host 28 to microcontroller 26 by SPI communication bus.

Figure 10:
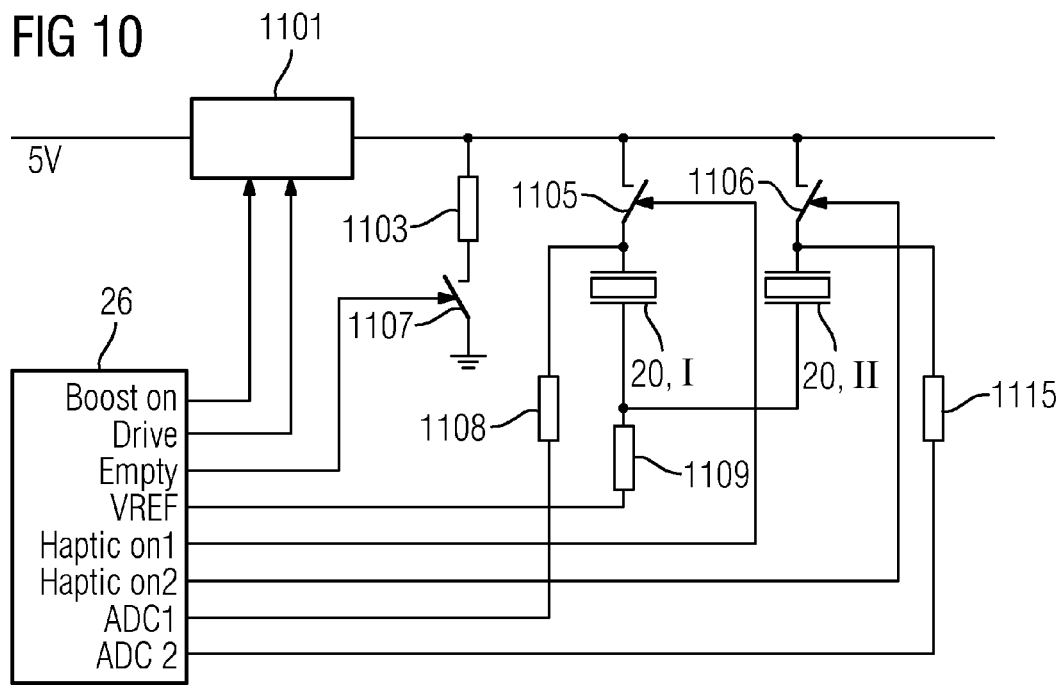
FIG. 10 is a simplified circuit showing certain components of the piezoelectric sensor.

FIG. 10 is a simplified circuit showing certain components of piezoelectric sensor 2.

When microcontroller 26 via line "Empty" closes switch 1107, first piezoelectric sensor elements 20, I and second piezoelectric sensor elements 20, II are returned to initial state. After this, microcontroller 26 opens switch 1107.

First piezoelectric sensor element 20, I is connected through resistors 1108, 1109 between the VREF and ADC1 pins of microcontroller 26. Second piezoelectric sensor element 20, II is connected through resistors 1115, 1109 between the VREF and ADC2 pins of microcontroller 26.

In the microcontroller, ADC1, ADC2 pins lead to the first and second analog-to-digital-converter channel. With this setup, the signal indicating voltage over first piezoelectric sensor element 20, I and second piezoelectric sensor element 20, II can be converted to digital signals and processed by microcontroller 26.

A voltage which may be 5 Volt DC, is provided to boost converter 1101. The purpose of boost converter 1101 is to raise the operating voltage across piezo element 20 up to 200 voltages to enable it to vibrate enough the device 1 surface 10 for tactile signalling. This is achieved via a typical boost (or "step-up") converter 1101 circuit, consisting of regular coil, FET, diode and capacitors. More details of the circuit are shown in FIG. 11 and FIG. 12.

When microcontroller 26 via line "Haptic on1" closes switch 1105, and lines "Boost_on" is active and "Drive" is pulsed, boost coverter 1101 sets a voltage over first piezoelectric sensor element 20, I which makes it vibrate.

When microcontroller 26 via line "Haptic on2" closes switch 1106, and line "Boost_on" is active and "Drive" is pulsed, boost converter 1101 sets a voltage over sets piezoelectric sensor element 20, II which makes it vibrate.

Figure 11:
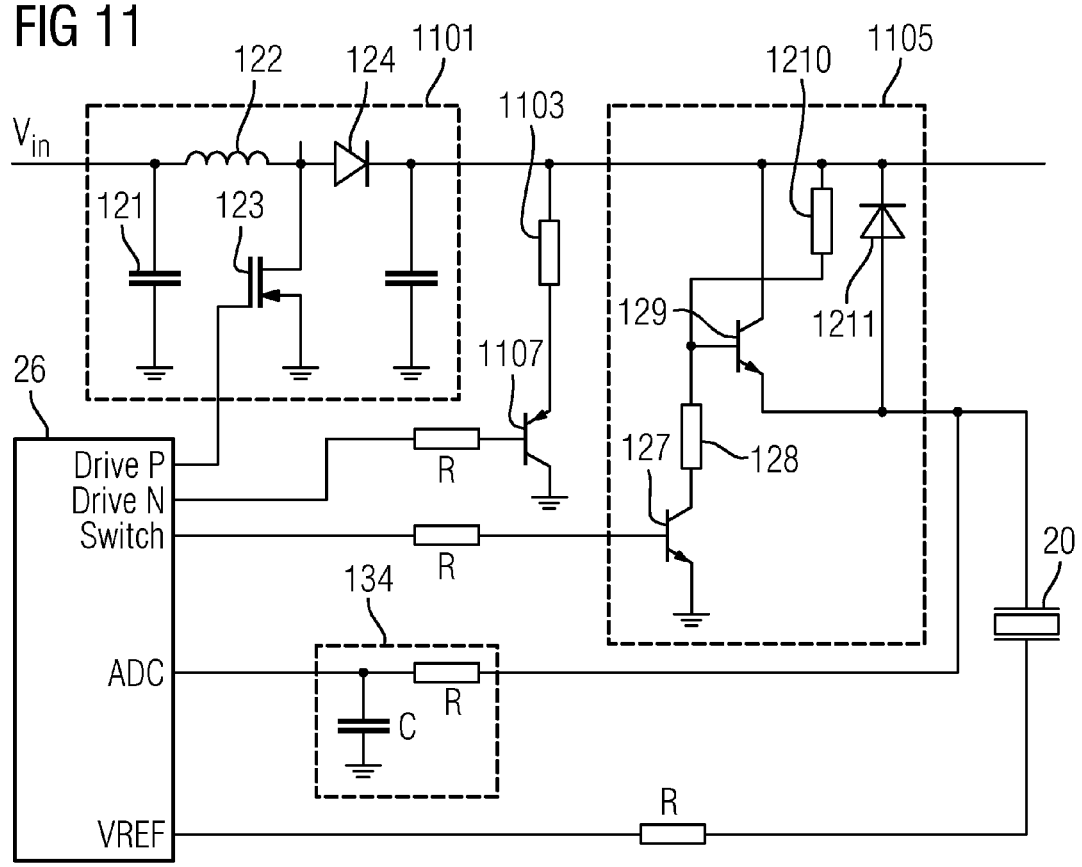
FIG. 11 is a more detailed circuit than that shown in FIG. 10, showing also details of the boost converter in more detail.
Figure 12:
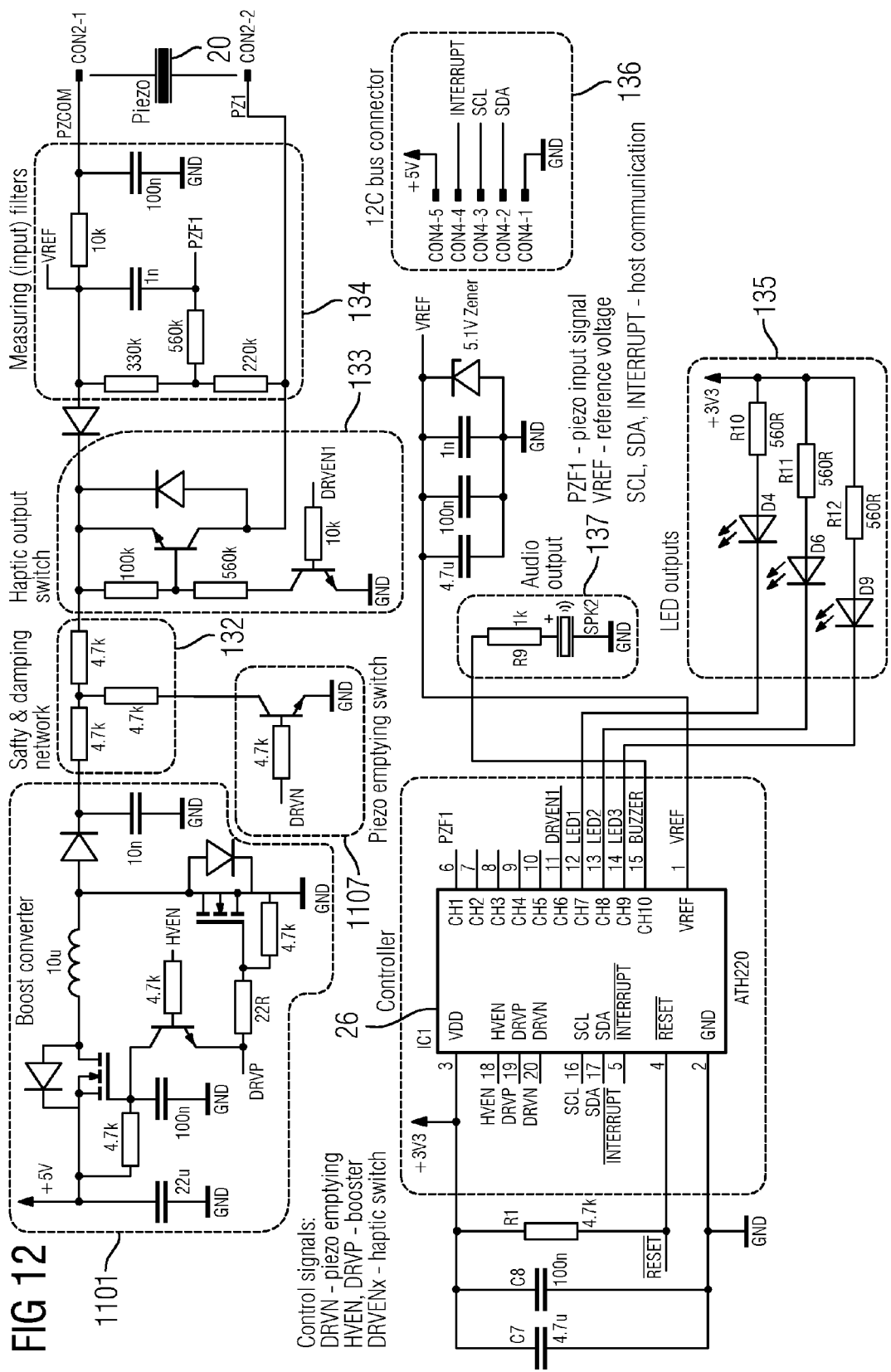
FIG. 12 is a detailed circuit diagram showing the components of the piezoelectric sensor.

FIG. 11 is a more detailed circuit than that shown in FIG. 10, showing certain details of the boost converter in more detail. In particular, in FIG. 12 we show that a boost converter 1101 circuit comprises or consists of input capacitor 121, coil 122, transistor switch 123 (typically fast N-type MOSFET), output diode 124, and the output capacitor. In the scope of the invention, the at least one piezo element 20 also functions as output capacitors for boost converter 1101. If there is a plurality of piezo elements 20 (I, II, . . . ), all or some of them can function as output capacitors for boost converter 1101.

Step-up conversion of the voltage bases on the tendency of the inductor (coil 122) to resist changes in current passing through it. Boost converter 1101 has two states, in one of them transistor switch 123 is closed, connecting the end of coil 122 to ground, and causing current to flow into coil 122 from the power supply signal $V_{in}$. Current flows in as long as transistor switch 123 is closed, and energy gets stored into magnetic field induced by coil 122. In the second state of the circuit, transistor switch 123 is opened, and the energy stored in coil 122 gets a new path to be released through the diode 124, eventually getting stored to the output capacitor, and in this case also to the at least one piezo element 20. Microcontroller 26 switches transistor switch 123 on and off so fast (typically in the range of hundreds of kHz) that coil 122 does not have time to fully discharge between the rapidly changing states of the boost converter 1101 circuit, hence building more and more voltage to the output capacitor(s). In the scope of piezoelectric sensor 2, the process of building the voltage by switching transistor switch 123 is also controlled by microcontroller 26 so that the rising edge of resulting voltage pulse gets a desired form, hence also shaping the haptic output pulse driven to the piezo through switch circuit formed using transistors 127 and 129. Similarly, the microcontroller 26 drives the emptying transistor 1107 rapidly on and off so that the falling edge of a haptic pulse is also shaped in a desired way.

FIG. 12 is a detailed circuit diagram showing the components of piezoelectric sensor 2. In addition to circuits already described in FIGS. 10 and 11, in FIG. 12 the structure of safety & damping network 132, haptic output switch 133, measuring (input filters) 134, 12C bus connector 136, audio output 137 and LED outputs 135 are described in more detail.

In other words, piezoelectric sensors 2 that are used in electrical appliances, installations or gadgets 1 as touch user interfaces are becoming significantly adaptive and communicative by moving from simple command-action mode to intuitive and responsive by exchanging the information in continuous manner by physical manipulation of piezoelectric sensor 2 by human fingers. This means that timing and time accuracy of the touch sensing and immediate associated feedback by three modalities: tactile vibration, illumination and sound are needed to be controlled below 1 millisecond level to enable virtually simultaneously responses by multiple feedback modality and channels within one modality. This can be achieved by dedicated microcontroller 26, but the real challenge lays in the efficient and reliable enough communication between such a microcontroller 26 and host 28 of devices 2 to achieve the benefits of responsiveness and adaptiveness of the whole electric appliance, installation or gadget 1. From one point of view, an objective of the invention can be seen in providing reliable and efficient communication structure between microcontroller 26 and host 28 as form of special register interface design. It can be used by low cost and resource microcontrollers 26 as dedicated touch controller and by most common communicational protocols between such microcontroller 26 and host device 28. This invention provides a solution to a similar problem, which is known as Tearing effect in visual display controllers, where the artifact occurs when the video buffer update to the device is not in sync with the display refresh signal.

Also the aim is to enable very low power consuming touch interfaces. In order to avoid the "tearing effect" for multimodal touch interaction i.e. readout or use of the commands/settings while they are being updated via communication link resulting in wrong or unidentified action or status of the system. This problem occurs, when low resource microcontrollers 26 are used (limited calculation power and memory) for rich touch interaction with various feedback channels and values (light, sound, tactile feedback). The problem gets more prominent when feedback is dynamically associated to touch input. As an example use case is adjusting the LED brightness, Sound frequency and tactile feedback rhythm according to inserted touch force by human finger.

Our approach is to use a two- or more dimensional register interface set comprising sensitivity threshold register 30 that most preferably is implemented as a matrix, comprising sensitivity threshold elements 100 in a number of dimensions (d>=2).

The sensitivity threshold register 30 is most preferably implemented as a register set consisting of a matrix of elements in amount of dimensions (d)>=2. The register may be read-only, write-only, read/write in RAM, ROM, or Flash or any applicable memory storage.

It may have different "rows" or "columns" into different dimensions that can be of any length towards the respective dimensions.

Access increment direction is selected per every access, to be one of the set dimensions.

Increment direction can also be negative along the dimension.

The implementation reduces amount of packets to be sent over the data link in "entity based" and "value based" accesses.

It is not dependent on any communication protocol.

It enables very energy efficient communication due to better header/payload ratio of the accesses (commands).

Minimum access to change the state of one byte (value of element 100) in the sensitivity threshold register 30 takes minimum 3 bytes (entity dimension 101 coordinate, value dimension 102 coordinate, and the data byte to be written or read). In I²C type serial bus the minimum access length becomes 4 bytes, as the I²C slave address needs to be added. Hence, for changing of one bit of one data byte at any element 100, 6 or 8 bytes are required to be transferred over data bus 27, as the data byte needs to be read by the host 28, the desired bit modified (keeping the state of the other bits), and then written back to the element 100 using the described addressing scheme. To access sensitivity threshold register 30 (which, as already explained, is advantageously implemented as a two-dimensional matrix of registers), any access over data bus 27 always includes a header consisting at least of two bytes, one containing a coordinate to first dimension 101 and the second byte containing a coordinate to second dimension 102, as seen in FIGS. 8 and 9 and FIG. 3. The rest of the bytes are then the payload data bytes that will get written to the register matrix as instructed using the header bytes by the host 28. The one full access always has a known beginning and an end, that can be recognized by microcontroller 26.

In the SPI bus this is by the means of a separate Chip Select (CS) signal (host 28 switches it to low potential before beginning, and switches it back to high state after the transfer has ended), and the in I²C bus by the "start condition" and slave address sending in the beginning and "stop condition" produced by host 26 when all the data bytes are written, as described in the I²C Bus Specification 2.1 of January 2000 by Philips Semiconductors.

Thus, microcontroller 26 always explicitly knows when a certain access is ready, and consequently also knows whether the access is still ongoing, and hence not ready, and that the host 28 is still sending more data over to data bus 27, to be written into the sensitivity threshold register 30, advantageously into the matrix.

A "byte" is considered to consist of 8 "bits" in all the examples, bit being a binary number, sometimes also represented by a digital signal state '0' or '1', corresponding with a lower and a higher electric potential.

In addition to the two coordinate bytes, a typical access over the I²C bus also requires one byte more per each access, namely "I²C slave address". This address byte consists of a 7 bit address coded into 7 most significant bits of the address byte and of the least significant bit, that indicates to the I²C peripheral or I²C bus driver of a controller 26 whether the access type is a read or a write. Hence the amount of additional header bytes for each full access is 3 for I²C bus (I²C slave address+$1^{st}$ and $2^{nd}$ dimension addresses), and 2 for SPI bus access ($1^{st}$ and $2^{nd}$ dimension address bytes).

In the example cases described in FIG. 8-9 the most significant bits (MSB) of the two coordinate bytes also indicate the nature of the access type. MSB of the first dimension (value) coordinate byte indicates whether the access is a write or read, setting the state for coming accesses J45 of FIG. 4. The MSB of the second dimension (entity) coordinate byte indicates the dimension of the access, corresponding with the step J43 in the flow diagram FIG. 4. Sending the two coordinate bytes over the bus, together form the step J42 of FIG. 4, setting the access origin.

Example of operating with 7 channels:
- With I²C communication bus the needed 80 bit can be transferred completely within 0.8 ms when f=100 kHZ, or within 0.2 ms when f=400 kHz
- and with SPI bus needed 72 bit can be transferred completely 0.07 ms when f=1 MhZ 1st Alternative:
Additional signal used to transmit access start/end information from host 28 to microcontroller 26, and every payload byte is transferred as a separate access.
- by I²C bus: 32 bit*7 takes 2.2 ms for I²C (100 kHz), 0.55 ms (f=400 kHz)
- by SPI bus: 24 bit*7 takes 0.168 ms (1 MHz)

2nd Alternative:
Separate "Start" and "End" command accesses could be sent using the same addressing method ($1^{st}$ dimension, $2^{nd}$ dimension, and the command byte) by host 28 to notify microcontroller 26 about the beginning and the end of a multi-byte access. In this manner, only 4+4 additional bytes are required to be sent over the data bus 27 (communication link) when I²C is used and 3+3 additional bytes when SPI bus is used.—increased timing overhead compromising dynamic touch interaction:

I²C communication bus: 32 bit*9, takes 2.88 ms (100 kHz bus frequency), or 0.72 ms (400 kHz) to complete the full access, such as setting a new set of sensitivity thresholds.

SPI communication bus: 24*9 bit, takes 0.22-0.264 ms (1 MHz bus frequency) to complete the full access.

By increasing the microcontroller 26 resources (preferably: by using one more pin in the microcontroller 26) or clock speed to enhance communication frequency. This will need more costly microcontrollers 26 (also hosts 28 in some times) and it will generally consume more energy in gross.

Our aim can also be to change properties of touch sensing, tactile/LED/buzzer feedback of multiple channels simultaneously DURING the one pressing event. For that let's consider an example use case:

a) Setup:
Set up button configurations one-by-one ("entity" access per each). As access a in FIG. 3, including for example one or more sensitivity thresholds.

Set up feedback pattern configurations ("entity" access per each) to signalling registers, illustrated as access c in FIG. 3. Feedback pattern may comprise information about haptic pulses, for example, amount of haptic pulses, LED blinks etc, and lengths of pulses or time intervals in between the different signallings.

b) During Usage:
User searches for keys, internal logic of the microcontroller 26 drives output channels based on the measured input signals and the set of feedback patterns At some point, based on its internal application logic and state changes, host decides to set sensitivity of all buttons to a new value Sensitivity thresholds are changed using one access illustrated with access b in FIG. 3, into value dimension 101, starting from the first button's sensitivity value element 100 in the sensitivity threshold register 30. In the case for 6 buttons, full access would consist of 6 sensitivity threshold value bytes, and 3 header bytes, when using I²C bus for accessing. So, for any given number of buttons, the number of sensitivity threshold value bytes would correspond to the number of buttons.

Any button can be set up with any—same or different—sensitivity threshold value supported by the microcontroller 26, in the sole discretion of host 28, related to any internal reasons that the host might have based on the application, environment conditions, etc.

During the course of the access, the microcontroller 26 knows that the sensitivity area is accessed, and either uses the old values during the access, or holds action before the access is finished, to prevent "tearing effects".

At some point host 28 decides to set new feedback pattern in the place of the pattern currently active.

Like access symbol c in FIG. 3 "entity" access to re-write setup values for the pattern representing the feedback signalling configuration. For example 10 bytes+3 header bytes, instead of the 4 bytes for access c in FIG. 3.

Microcontroller 26 knows that the pattern area is being accessed to set or adjust contents of the sensitivity threshold register and that the access is still on-going, and either uses the old pattern values during the access, or halts action before the access is finished, to prevent so-called tearing effects.

To emphasize the meaning of synchronization gained with the present invention, let's consider the last case where the whole 13 byte access could take about 1 millisecond using the present invention, and in total even 4×10×8 bits=3.2 ms (100 kHz I²C) of time using byte-by-byte access.

If microcontroller 26 uses e.g. 20 Hz refresh rate in its internal processing to set up properties for a certain output signal, it requires new values in every 50 ms, as well as uses the once-read values for the next period of 50 ms. Thus if host 28 happens to be updating the pattern values just when the microcontroller 26 is reading them to set up for a new 50 ms cycle—which would not even be very unlikely, considering the update taking 6% of the refresh cycle—the output signal can be generated partly using the old and partly using the new value set. For the user this could mean anything between a slight tone change to a rapid and rough discrepancy in the output signal, and anyway something that the user interface designer did not intend to happen. This phenomenon is very similar to the disturbance known as "tearing effect" in driving the displays of electronic devices.

Worst thing in the described situation is that microcontroller cannot know at which point the host has made all the changes it is intending to make, if every byte is accessed separately with separate access. Thus the present invention—along with enabling shortening the writing time as such—enables the Microcontroller to know when host is done with its update, as the update is always done using one access per a certain entity. With this knowledge microcontroller 26 can either choose to use the earlier values stored to its internal cache memory from the earlier values of sensitivity threshold register 30, for output signalling yet for one 50 ms cycle, or to wait until the access is ready and only then use the new values that are now fully written by the host 28 to the group of elements 100 in sensitivity threshold register 30 and that together contain all signalling parameters required by the microcontroller 26 to create the corresponding user experience through the haptic, audio and optical means, using its output signal channels like CHx, HVEN, DRVP and DRVN in the FIG. 12

Self-Configuring Embodiment:

In one additional embodiment, the controller can deduce one of the values per each entity based on its internal logic and surrounding electronics, like pin states (input/output, LED/Piezo, etc). With the present invention host can read these values using one value dimension access, after which the rest of the values of each entity can be written based on the first read values, using one entity dimension access per entity. Thus, for example, a recognized input entity gets written with input configuration bytes, and a LED output can be written with respective output configuration bytes.

Host 28 sets two different sensitivity threshold values to the sensitivity threshold register 30, using data bus 27 and method described earlier. The microcontroller 26 tracks the voltage between signals PZF1 and VREF (cf. FIG. 12), and with a soft human touch recognizes the voltage (hence the applied force to the piezoelectric sensor element 20) exceeded (or fell below) the first threshold in the sensitivity threshold register 30. In response to this, microcontroller 26 can use its INTERRUPT signal to notify host 28 about this event, and/or use any of its output signals (CH1-CH10, DRVP, DRVN, HVEN) to give feedback to the user audibly, haptically and/or optically. After getting a signal through the INTERRUPT line, host 28 can also query through data bus 27 from the microcontroller 26 about the nature of the event. In this case it could be that the user has found the key and is softly touching it but not selected it yet. The sensitivity threshold register 30 can also contain values to describe how the mentioned signals are driven in response to the reached sensitivity threshold.

If after this the user still keeps increasing the force applied to the piezoelectric sensor element 20, the microcontroller 26 keeps comparing the measured voltage from PZF1 and VREF to the second sensitivity threshold value in sensitivity threshold register 30. After the second sensitivity threshold value has been reached, the microcontroller 26 can again notify the host 28, and/or give the same or different feedback using some or all the aforementioned signals and the set signalling values in the sensitivity threshold register 30. Also similarly after getting notified by the INTERRUPT signal, host 28 can query for the information about this new event, which in the case of the second threshold reached could be "the key was pressed".

Alternatively to this, or in addition to this, microcontroller 26 may independently create output signals so that the piezoelectric sensor element 20 (or some or all of the at least one piezoelectric sensor element 20) is activated with certain known pulse(s) or voltage level. This can be done by setting the signal DRVEN1 from microcontroller 26 port CH6 high in FIG. 12 and signal HVEN from port HVEN also high, and pulsing signal DRVP to the boost converter 1101 circuit, so as to build up a known potential difference over the piezoelectric sensor element 20 (between signals PZCOM and PZ1). After and during the potential is being built up, the microcontroller 26 is using its analog to digital converter input to measure the corresponding voltage built up between the signals PZF1 and VREF, indicative of the voltage between PZCOM and PZ1. After that microcontroller 26 closes the boost converter 1101 and haptic switch by setting signals HVEN and DRVEN1 to zero, and begins emptying the voltage from the at least one piezoelectric sensor element 20, using the signal DRVN from digital output port DRVN. Also during the emptying phase it continues to track the voltage between PZF1 and VREF, and using the information adjusts the sensitivity threshold values in sensitivity threshold register 30.

Using at least one relation between the signal PZF1-VREF that is indicative of the voltage PZCOM-PZ1 over two terminals of the piezoelectric sensor element 20 and feedback that is done via any or all of the signalling means (for example, sensor element 20 for haptic feedback, at least one LED 22, and/or at least one buzzer 24):

Microcontroller 26 may be configured to change or select a relation in which the signalling means (at least one piezoelectric sensor element 20 for haptic feedback, at least one LED 22, and/or at least one buzzer 24) are used. Relation is a rule or set of rules stored in the memory of microcontroller 26, and defining detailed properties of how the signalling means are drivent dependent on voltage between signals PZF1 and VREF (cf. FIG. 12).

The relation may be stored in read-only, write-only or read/write RAM, ROM, or Flash type memory or any applicable memory storage.

The rule can be a threshold or set of thresholds as described earlier or it can be a function or set of functions or a look-up table or a set of look-up tables, or any combination of them. Elements 100 in the sensitivity threshold register 30 can be the criteria to apply certain rule or rules. Rule priorities are set by host 28 by setting element values 100 in sensitivity threshold register 30 over the data bus 27.

The relation, the rule or part of the rule can be affected by elements 100 in sensitivity threshold register 30.

In particular, the microcontroller 26 may be configured to use the value of at least one element 100 of the sensitivity threshold register 30 as a threshold, or an index pointing to look-up table, or a parameter of a function, or a coefficient of a function, and/or a part of a function.

In one practical embodiment, microcontroller 26 is configured to set the interval between separate pulses of feedback (pulses are formed using any output signalling means of the microcontroller 26) output through the signalling means, based on the function.

The function may also be dependent on the signal (PZF1-VREF) indicative of the voltage (PZCOM-PZ1). In this manner, the function may be dependent on the amount of finger's pressure on a piezoelectric element 20, and said relation being the function, e.g.: interval (in seconds)=1/coefficient/pressure (in Newtons). The value written by the host 28 to an element 100 in the sensitivity threshold register 30 then directly describes the said coefficient, so that the function creates pulse intervals in the range of tens or hundreds of milliseconds. By setting different coefficient values, the intervals calculated by the microcontroller 26 using this function will thus decrease faster or slower in relation to the increasing or decreasing pressure on the piezoelectric element 20, creating experience of "tighter" (higher value for the coefficient) or "softer" (lower value) response for the user of the electric appliance, installation or gadget.

When an application in the host 28 is in certain state, and the microcontroller 26 that controls the user interface is configured accordingly by the host 28 over the communication bus 27, and the user is touching the piezoelectric sensor element(s) 20, there may be a situation where the host 28 gets from the microcontroller 26 an event, which signifies a user event, which in turn causes the application to change its internal state.

When the application's internal state changes in the host 28, it may require the user interface to be set to a different state accordingly, in particular regarding its recognition thresholds, and feedback parameters.

In particular if there are multiple configurable input channels, and multiple configurable output channels, for e.g. haptic, audible and optical feedback. When these properties need to be updated by host 28 over communication bus 27 during the output driving by the microcontroller 26, the updates were likely to eventually run into so called tearing effect problem if the alternative, combinable features i) and/or ii) in claim 1 were not used.

A similar issue is well known in display control, and is usually addressed by reserving double amount of RAM to actually store two full images, of which one is written to, while another is kept on the visual display, and the buffers switched when the said first buffer is fully written. This however, is not practically possible within the limitations of a low resource microcontroller, in particular its RAM size, used in piezoelectric sensor 2.

Figure 13:
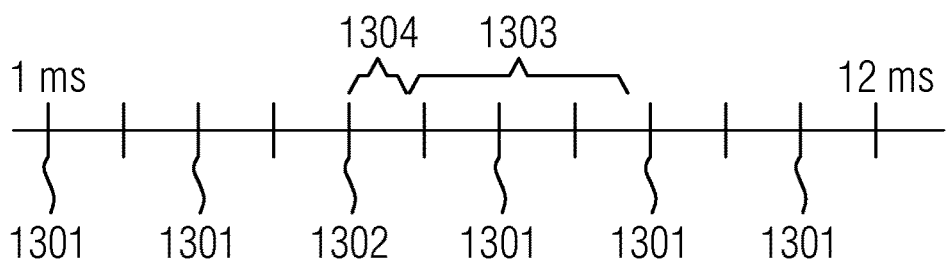
FIG. 13 is a timeline, illustrating the transmission of threshold commands in the serial communication bus.

In FIG. 13, microcontroller 26 measures its inputs and updates its output drivings at steps 1301 & 1302. In step 1302 it additionally notifies the host 28 about an event, like key being pressed by the user (threshold exceeded). During the time 1304 the application in host 28 processes this event, and deduces its new state based on the information. After reaching a new state, host 28 sends an updated configuration to the microcontroller 26, which takes the time 1303.

In the example of FIG. 13, the configuration sending time 1303 overlaps with a one of microcontroller's 26 update points 1301. If now this overlap is not handled in any way, the microcontroller 26 may end up configuring its outputs partly with the old parameter values (the part that would be transferred after the said point 1301), and partly with the new parameter values, i.e. the part that is already transferred and set to the registers in the microcontroller 26.

To overcome this, the present invention provides an efficient way to rapidly update multiple measurement parameters for an individual input, or driving parameters for individual output means, or alternatively similar parameter or 'value' (like threshold) for multiple input or output means at once, always using only one "atomic operation", i.e. one transmission having distinct beginning and end, but in all cases in total only small amount of header data compared to actual payload data, over communication bus 27.

The situation of FIG. 13 may in practice occur for example when application state in host 28 changes because of the user actions, after which the host 28 decides to set sensitivity of all buttons to a new value, to correspond with the new state of the application itself.

Host 28 uses serial data bus 27 described in FIGS. 6 and 7 and follows the flow chart shown in FIG. 4. On the other end of serial data bus 27, the microcontroller 26 follows the flow chart in FIG. 5 to access and write the received information in its internal sensitivity threshold matrix 30, as commanded by host 28. During this short (i.e. short when compared to other required processing in an user interface controller's time scale in millisecond level) operation microcontroller 26 knows to not use the contents of the accessed area before the operation is finished, i.e. condition K56 fulfilled in the flow chart of FIG. 5. Hence effectively preventing any 'tearing effects' arising from simultaneously using one part of an older data set, and another part from an updated data set. And this also without a need for adding such long delays to the process that would in turn affect the user experience.

The many features and advantages of the present invention are apparent from the written description. Further, since numerous modifications and changes will be readily apparent to those skilled in the art, the invention should not be limited to the exact construction and operation as illustrated and described. Hence, all suitable modifications and equivalents may be resorted to as falling within the scope of the invention.

In particular, microcontroller 26 can be a separate integrated circuit, a programmable gate array (PGA), a synthetized or integrated microcontroller core in a programmable gate array, a custom application specific integrated circuit (ASIC), or any other device that can execute a program.

Different matrix registers have been disclosed e.g. in US 2006/0036801 A1; U.S. Pat. No. 8,327,087 B1; and U.S. Pat. No. 6,021,482. Also http://www.bergs.com/stefan/papers/iccd2000.pdf addresses this topic.

LIST OF REFERENCE NUMERALS USED

1 electric appliance, installation or gadget
2 piezoelectric sensor
10 device surface
11 recess
12 conductive foil
13 metal plate
14 double-sided adhesive
16 two-layer printed circuit board
18 conductive adhesive
20 piezoelectric sensor element
22 LED
24 buzzer
26 microcontroller
27 serial data bus
28 host
30 sensitivity threshold register
60*a*, 70*a* clock signal line
60*b*, 70*b* data signal line
61 write "1"
62 write "0"
100 element in sensitivity threshold matrix (sensitivity threshold value)
101 values direction (first dimension)
102 entities direction (second dimension)
105 access origin
106 entity access
107 value access
121 input capacitor
122 coil
123 transistor switch
124 diode
127 transistor
129 transistor
132 safety & damping network
133 haptic output switch
134 measuring (input) filters
135 LED outputs
136 I2C bus connector
137 audio output
1101 boost converter
1103 resistor
1105 switch
1106 switch
1107 transistor
1108 resistor
1109 resistor
1115 resistor
1210 resistor
1211 diode
1301 step
1302 step
1303 time
1304 time

The invention claimed is:

1. A piezoelectric sensor (2), comprising:
at least one piezoelectric sensor element (20) having at least two terminals (CON2-1, CON2-2); and
a microcontroller (26) electrically connected to said at least one piezoelectric sensor element (20) and configured to read a signal (PZF1-VREF) indicative of a voltage (PZCOM-PZ1) between the at least two terminals (CON2-1, CON2-2), and to output at least one output signal (INTERRUPT, BUZZER, DRVEN1, HVEN, LED1, LED2, LED3, DRVP, DRVN) in response to the signal (PZF1-VREF) read, indicating that the piezoelectric sensor element (20) is being pressed or has been pressed by a finger;
and wherein;
the microcontroller (26) comprises at least one two or more dimensional sensitivity threshold register (30) containing at least one sensitivity threshold;
the microcontroller (26) is configured to evaluate the signal (PZF1-VREF) indicative of the voltage (PZCOM-PZ1) depending on the sensitivity threshold, in consequence of which a sensitivity of the piezoelectric sensor (20) is defined;
and wherein: the microcontroller (26) is configured, in response to receiving at least one sensitivity threshold command from a host (28) over a serial data bus (27), to set or to adjust the sensitivity threshold in the at least one two or more dimensional sensitivity threshold register (30), wherein the serial data bus (27) for receiving sensitivity threshold commands is one of an I²C data bus or an SPI data bus, and whereby the microcontroller (26) is adapted:
  i) after receiving the sensitivity threshold command, to continue using the at least one actual sensitivity threshold until the sensitivity threshold command has been completely processed and the at least one two or more dimensional sensitivity threshold register (30) has been updated by the microcontroller (26), and then to swap to using the updated at least one two or more dimensional sensitivity threshold register (30) with the adjusted sensitivity thresholds; or:
  ii) after receiving the sensitivity threshold command, to discard any signals from all piezoelectric sensor elements (20) or at least from such piezoelectric sensor elements (20), to the sensitivity threshold of which the sensitivity threshold command relates, until the microcontroller (26) has completely processed the sensitivity threshold command and updated the at least one two or more dimensional sensitivity threshold register (30);
  wherein the at least one two or more dimensional sensitivity threshold register (30) comprises one or more sensitivity threshold values (100), each of which is a function of the magnitude of the voltage (PZCOM-PZ1), the length of the voltage (PZCOM-PZ1) window, and/or the number of voltage (PZ-COM-PZ1) sequences that are required to accept signal (PZF1-VREF) from a piezoelectric sensor element (20) as a user input;
  wherein the plurality of sensitivity threshold values (100) is stored in a two-dimensional matrix in said at least one two or more dimensional sensitivity threshold register (30); and
  wherein the microcontroller (26) is configured to change said sensitivity threshold values (100) stored in said two-dimensional matrix in a given row or column of said two-dimensional matrix in response to receiving the sensitivity threshold command (105, 106, 107).

2. The piezoelectric sensor (2) according to claim 1, wherein: the piezoelectric sensor (2) comprises a plurality of piezoelectric sensor elements (20) and the at least one two or more dimensional sensitivity threshold register (30) comprises a plurality of sensitivity threshold values (100) each defining a sensitivity threshold; and wherein: in the microcontroller (26), each of the sensitivity thresholds is associated to a particular piezoelectric sensor element (20) or to a group of piezoelectric sensor elements (20).

3. The piezoelectric sensor (2) according to claim 2, wherein: the microcontroller (26) is configured to adjust or to set sensitivity threshold values (100) for a plurality of piezoelectric sensor elements (20) individually in response to receiving the sensitivity threshold command.

4. The piezoelectric sensor (2) according to claim 1, further comprising:
  one or more signalling devices (24, 20, 22), responsive to said microcontroller (26), and configured to acoustically, haptically and/or optically signal that the pressing on the at least one piezoelectric sensor element (20) by the finger has exceeded a sensitivity threshold, is below a sensitivity threshold, or matches with a sensitivity threshold;
and wherein: the microcontroller (26) further comprises at least one signalling register and is configured, in response to receiving at least one signalling register command from the host (28) over the serial data bus (27), to set or adjust the at least one signalling register;
and wherein: the microcontroller (26) is configured to change an operating pattern according to which one of the one or more signalling devices are activated depending on the contents of the at least one signalling register.

5. The piezoelectric sensor (2) according to claim 4, wherein: the signalling devices (24, 20, 22) are selected from the group of signaling devices consisting of a loudspeaker (22), a buzzer (24), any of the at least one piezoelectric sensor element(s) (20) of the piezoelectric sensor (2), and a lamp, in particular an LED (22).

6. The piezoelectric sensor (2) according to claim 4, wherein: the microcontroller (26) is configured to use the piezoelectric sensor element (20) as the signaling device (20) on which the pressing by the finger is being detected or has been detected, to give tactile feedback by switching on and off a signal (Haptic on1, Haptic on2, Boost on, Drive) to be emitted through the piezoelectric sensor element (20).

7. The piezoelectric sensor (2) according to claim 4, wherein: the sensitivity threshold command is transmitted in a signaling register command or vice versa.

8. The piezoelectric sensor (2) according to claim 4, wherein: the microcontroller (26) is configured to switch on a signal (Haptic on1, Haptic on2, Boost on, Drive) to be emitted through the at least one piezoelectric sensor element (20), and during the piezoelectric emitting the signal, to switch off the signal (Haptic on1, Haptic on2, Boost on, Drive) and to measure the voltage (PZF1-VREF) indicative of the voltage (PZCOM-PZ1) between the two terminals (CON2-1, CON2-2) of the same at least one piezoelectric sensor element (20), and to use the measured voltage (PZF1-VREF) for self-calibration of the piezoelectric sensor (2).

9. The piezoelectric sensor (2) according to claim 1, wherein: the microcontroller (26) is configured to:
  use at least two sensitivity levels for interpretation of the signal (PZF1-VREF) indicative of the voltage (PZ-COM-PZ1) between the two terminals (CON2-1, CON2-2) of the at least one piezoelectric sensor element (20) during one touch interaction; and/or
  apply at least one relation stored in the microcontroller (26) to select a relation between the signal (PZF1-VREF) indicative of the voltage (PZCOM-PZ1) between the two terminals (CON2-1, CON2-2) of the at least one piezoelectric sensor element (20) and driving of the at least one signalling device (24, 20, 22) during the touch interaction.

10. An electrical appliance, an installation or a gadget (1) according to claim 1 comprising:
  a host (28)
  a device surface (10); and
  at least one piezoelectric sensor (2) according to claim 1, arranged below the device surface (10) in such a manner that, and wherein said device surface is configured such that when the device surface (10) is being pressed with a finger, the at least one piezoelectric sensor element (20) of the piezoelectric sensor (2) proximate said device surface that is being pressed with a finger is bent, generating a voltage (V) over the at least one piezo electric sensor element (20), and connected to the host (28) via a serial data bus (27);
and wherein:
  the host (28) is configured to use at least one output signal (INTERRUPT, BUZZER, DRVEN1, DRVP, DRVN) transmitted to the host (28) from the microcontroller (26) over the serial data bus (27) as user input to the appliance, the installation or the gadget (1).

11. The electrical appliance, installation or gadget according to claim 10, wherein:

the piezoelectric sensor (2) further comprises:
- at least one signalling device (24, 20, 22) configured to acoustically, haptically and/or optically signal that the pressing on a piezoelectric sensor element (20) by the finger has exceeded a sensitivity threshold, is below a sensitivity threshold, or matches with a sensitivity threshold;
- and wherein: the microcontroller (26) further comprises at least one signalling register and is configured, in response to receiving at least one signalling register command from the host (28) over the serial data bus (27), to set or adjust the at least one signalling register;
- and wherein: the microcontroller (26) is configured to change an operating pattern according to which of the at least one signalling devices are used depending on the contents of the at least one signalling register;
- and wherein the electrical appliance, the installation or the gadget (2) is configured to use the at least one signalling device (24, 20, 22) acoustically, haptically and/or optically to signal to that user input has been entered.

12. The electrical appliance, installation or gadget according to claim 11, wherein: the electrical appliance, the installation or the host (28) is configured to command the microcontroller (26) to set or to adjust the sensitivity threshold between two consequent user inputs.

13. The electrical appliance, installation or gadget according to claim 10, wherein: the electrical appliance, the installation or the gadget (1) is configured to adjust or set the sensitivity threshold for at least one piezoelectric sensor element (20) of the piezoelectric sensor (2) between the function of a touch switch and a force meter which detects a discrete number of force magnitudes.

14. The electrical appliance, installation or gadget (1) according to claim 10, wherein:
- the piezoelectric sensor element (20) is also configured to produce a signal to the at least one piezoelectric sensor element (20) to make it vibrate;

and wherein:
- the electrical appliance, installation or gadget (1) is configured to calibrate the sensitivity of the at least one piezoelectric sensor element (20) by i) producing a test signal to the at least one piezoelectric sensor element (20) and ii) comparing the signal (PZF1-VREF) indicative of the voltage (PZCOM-PZ1) of the at least one piezoelectric sensor element (20) caused by the test signal, and iii) setting or adjusting the sensitivity threshold so that the at least one piezoelectric sensor element (20) produces a user input as a response to the test signal.

\* \* \* \* \*